United States Patent [19]

Fuse et al.

[11] Patent Number: 5,466,612
[45] Date of Patent: Nov. 14, 1995

[54] METHOD OF MANUFACTURING A SOLID-STATE IMAGE PICKUP DEVICE

[75] Inventors: Genshu Fuse, Toyonaka; Katuya Ishikawa, Kyoto, both of Japan

[73] Assignee: Matsushita Electronics Corp., Osaka, Japan

[21] Appl. No.: 82,626

[22] Filed: Jun. 24, 1993

Related U.S. Application Data

[63] Continuation of Ser. No. 26,951, Mar. 5, 1993.

[30] Foreign Application Priority Data

Mar. 11, 1992 [JP] Japan ........................... 4-52376

[51] Int. Cl.$^6$ ............................... H01L 21/339
[52] U.S. Cl. .................. 437/3; 437/24; 437/53; 437/905
[58] Field of Search .............. 437/3, 2, 51, 53, 437/905, 23, 24

[56] References Cited

U.S. PATENT DOCUMENTS

| 4,197,633 | 4/1980 | Lorenze, Jr. et al. ............... 437/3 |
| 4,506,436 | 3/1985 | Bakeman, Jr. et al. ............. 437/51 |
| 4,746,622 | 5/1988 | Hawkins et al. ................... 437/29 |
| 4,977,096 | 12/1990 | Shimada et al. .................. 437/2 |
| 5,146,297 | 9/1992 | Collins et al. . | |

FOREIGN PATENT DOCUMENTS

| 1292857 | 11/1989 | Japan . |
| 2266565 | 10/1990 | Japan . |
| 3266465 | 11/1991 | Japan . |
| 4167469 | 6/1992 | Japan . |
| 4218966 | 8/1992 | Japan . |
| 5003311 | 1/1993 | Japan . |
| 5251680 | 9/1993 | Japan . |

*Primary Examiner*—Brian E. Hearn
*Assistant Examiner*—Michael Trinh
*Attorney, Agent, or Firm*—Rogers & Wells

[57] ABSTRACT

A dielectric film is formed on a P type silicon substrate. Then a specified resist pattern is formed on the dielectric film. Using this resist pattern as the mask, a phosphorus ion beam is implanted. Then, removing the resist pattern, heat treatment is given. By this heat treatment, a photo diode is formed in a depth of about 1 μm. A specified resist pattern is formed again on the dielectric film. Using this resist pattern as the mask, boron ions are implanted. Thus, a channel stopper region is formed. Afterwards, removing the resist pattern, the dielectric film is removed. Again, a dielectric film is formed on the silicon substrate. Later, a stacked oxide film is formed in the other regions than the region for forming the photo diode on the dielectric film. Using the stacked oxide film as the mask, a boron ion beam is implanted. When operated in such conditions, a P type diffusion layer of opposite conductive type of photo diode was formed on the surface of the photo diode, and the leak current in the photo diode becomes low. Consecutively, a fluorine ion beam is implanted on the entire surface of the silicon substrate. Thus, on the surface of the photo diode and on the P type diffusion layer, a diffusion layer by fluorine is provided. Thus, to suppress the leak current generated in the photo diode, the interface state density is lowered, while the level of implantation defects may be suppressed at the same time.

2 Claims, 12 Drawing Sheets

METHOD OF MANUFACTURING A SOLID-STATE IMAGE PICKUP DEVICE

This is a continuation of U.S. Ser. No. 08/026,951, filed Mar. 5, 1993, pending.

BACKGROUND OF THE INVENTION

1. Field of the Invention

The present invention relates to a method of manufacturing a semiconductor device for improving the leak current of a photo diode formed on a silicon Very-LSI, a solid-state image pickup device using the same, and method of manufacturing the same.

2. Description of the Related Prior Art

In order to convert light into an electric signal, a photo diode is generally used. A photo diode formed on a silicon substrate allows an signal converted into an electric signal to propagate and leak through the silicon substrate. This leak signal is called a dark current. As the dark current increases, signal portions of abnormal level not corresponding to the quantity of light to be used in small quantity of light are generated, and it cannot be used as a normal device. As causes of such dark current, the interface state density of the silicon substrate surface and process induced defect are considered. Hence, to suppress the dark current, it is necessary to prevent the effects of interface state density on the silicon substrate surface and crystal defect. Accordingly, an impurity layer of opposite conductive type for photo diode is formed on the surface of the photo diode. Therefore, when a voltage is applied to the device, the depletion region extended from the photo diode is prevented from growing up to the surface side.

Concerning this conventional method, its structure is described below by reference to FIGS. 14 and 15. On a P-type silicon substrate 1, an oxide film 2 containing silicon oxide film or silicon nitride is formed. A mask 3 is formed on the oxide film 2. After opening the specified position of the mask 3, a phosphorus ion beam 4 is selectively implanted. By subsequent heat treatment, phosphorus ions are diffused to a depth depending on the characteristics. By this phosphorus ion implantation, an N type diffusion layer of a relatively low concentration is formed as a photo diode 5.

Furthermore, as shown in FIG. 15, a boron ion beam 7 is implanted in the silicon substrate surface to form a P type diffusion layer 6.

An oxide film, electrodes, a metal wiring are further formed thereon to form a device in a desired structure. As an example of this element, FIG. 16 shows a sectional structure of a photo diode and reading part in a solid-state image pickup device of CCD (charge coupled device) type. A P type well 11 is formed on a silicon substrate 10, and a photo diode 12 and a transfer channel 13 are formed thereon. A gate dielectric film 14 is formed on the silicon substrate 10. A transfer gate electrode 15 is formed on the transfer channel 13 through the gate dielectric film 14. A dielectric film 16 is formed on the transfer gate electrode 15. A metal wiring 17 is formed thereon. Further thereon, a flattened film 18 is formed. A color filter 19 is formed thereon, and a micro lens 20 of resin material is formed thereon.

In such structure, the light condensed by the micro lens 20 accumulates electrons in the photo diode 12, and applies a voltage for reading to the transfer gate electrode 13. As a result, the electrons are read out from the photo diode 12 to the transfer channel 13. An image can be composed by disposing a plurality of the photo diodes 12 vertically and laterally. At this time, P diffusion layers 21 are formed on the surface of the photo diodes 12. when the photo diode 12 of N type diffusion layer is formed in contact with the interface between the silicon substrate 10 and gate dielectric film 14, a leak current is generated by the effect of the interface level existing on the interface. As a result, the characteristics of the solid-state image pickup device deteriorate. however, if attempted to introduce the impurity concentration of the P type diffusion layer 21 by ordinary ion implantation method, an injection defect may occur on the surface of the silicon substrate 10 by ion implantation, which may cause a leak current. Consequently, in spite of the efforts to prevent leak current, sufficient improvement effect is not obtained. To prevent such occurrence of injection defect by ion implantation, the hydrogen annealing method is effective. The hydrogen atoms introduced into the silicon substrate 10 by hydrogen annealing slip out of the interface between the silicon substrate 10 and gate dielectric film 14 when heat and light are added to the silicon substrate 10. Hence, the stability of the device is poor, and a problem occures in the reliability if storing the device for a long time after manufacture.

As other method of reducing the interface state density, a method of introducing fluorine atoms is proposed. For example, it is reported in the Japanese Journal of Appl. Physics, Vol. 28, No. 6, 1989, p. 1041. It is also reported, by G. S. Virdi et al., in the Solid-State Electronics, Vol. 34, No. 8, p. 889. Accordingly to them, it is reported that the interface state density can be reduced by injecting fluorine atoms. In this case, for fluorine injection, by using fluorine molecule ions of boron, such as $BF_2$ and BF ions as the ion seeds, fluorine atoms are introduced into the silicon substrate 10 together with boron atoms. For example, using $BF_2$, ion implantation is effected at the acceleration energy of 155 keV and dose of $1 \times 10^{14}$ $cm^{-2}$. The depth distribution of impurity concentration of boron and fluorine at this time is equivalent to the acceleration energy of 35 keV by ion implantation of boron alone, and fluorine corresponds to the acceleration energy of 60 keV.

In the constitution of the prior art, however, a defect layer by fluorine is formed nearly to the same depth as the boron profile. Afterwards, if the injected region by boron ion is widened by heat treatment, the defect layer introduced by fluorine ion implantation is seated at a deeper position. Accordingly, a voltage is applied to the N type diffusion layer of the photo diode 12, the depletion layer of the N type diffusion layer is elongated, growing up to the defect layer by fluorine. When the depletion layer reaches the defect layer, a leak current is generated therefrom, thereby extremely deteriorating the element characteristics. In the element in which leak current is not a serious problem, it does not matter if ions are implanted by using $BF_2$, but in the case of handling a feeble electric charge, such as a solid-state image pickup device, only a slight leak current may become a dark current in the image, and a white blemish may appear unexpectedly. Therefore, if attempted to pick up an image in low quantity of light, it becomes a white blemish, and practicable solid-state image pickup device is not realized. The problem of defect is same as in the characteristic deterioration of the device by junction leak in ordinary bipolar device or MOS device, but it rarely appear as slight unevenness of the image as in the solid-state image pickup device, so that the effect of the crystal defect does not appear on the surface. In other words, the effect of injection defect is greater in the solid-state image pickup device than in other devices.

As described herein, to suppress the leak current occurring in the photo diode, it is necessary to satisfy the two requirements at the same time, that is, to reduce the interface level density and to lower the level of injection defect.

SUMMARY OF THE INVENTION

To solve the above problems, the invention presents a method of manufacturing semiconductor device comprising at least a step of forming a photo diode of one conductive type on a semiconductor substrate, a step of forming an impurity layer of opposite conductive type of the photo diode on the semiconductor substrate surface of the photo diode, and a step of introducing a fluorine ion into the impurity layer.

To solve the problems, the invention also presents a solid-state image pickup device comprising a semiconductor substrate, a photo diode of one conductive type formed on the semiconductor substrate, a transfer channel formed on the semiconductor substrate at a specific gap from the photo diode, a transfer gate electrode formed on the semiconductor substrate through a gate dielectric film, an interlayer film formed on the transfer gate electrode, a light-shield film formed on the interlayer film for shielding the transfer channel from light, and an interlayer dielectric film formed on the light-shield film, wherein a first diffusion layer of the opposite conductive type of the photo diode is formed on the surface of the photo diode, and a second diffusion layer composed of fluorine as impurity is formed on the surface of this diffusion layer.

To solve the problems, the invention moreover presents a method of manufacturing a solid-state image pickup device comprising a step of forming a photo diode of one conductive type on a semiconductor substrate, a step of forming a transfer channel on the semiconductor substrate at a specific gap from the photo diode, a step of forming a gate electric film on the semiconductor substrate, a step of forming a transfer gate electrode on the transfer channel through the gate dielectric film, a step of forming an interlayer film on the transfer gate electrode, a step of forming diffusion layers by implanting the ions of an impurity of the opposite conductive type of the photo diode and fluorine simultaneously or alternately from above the interlayer film, and a step of forming a light-shield film for shielding the transfer channel for light.

An N type impurity is introduced into the P type substrate or P well in order to form a photo diode. In the state free from effects in the boron implantation region to be formed later, that is, in the vicinity of the surface of silicon, or in the condition that fluorine is nearly remaining within the oxide film formed on the surface, fluorine ions are implanted. That is, fluorine and boron are implanted by selecting an implantation energy so that the fluorine projection flight is sufficiently smaller than the projection flight of boron. The sequence of implantation of boron and fluorine is not particularly specified, and same effects are obtained in either sequence.

DESCRIPTION OF THE PREFERRED EMBODIMENT

Figure 1:
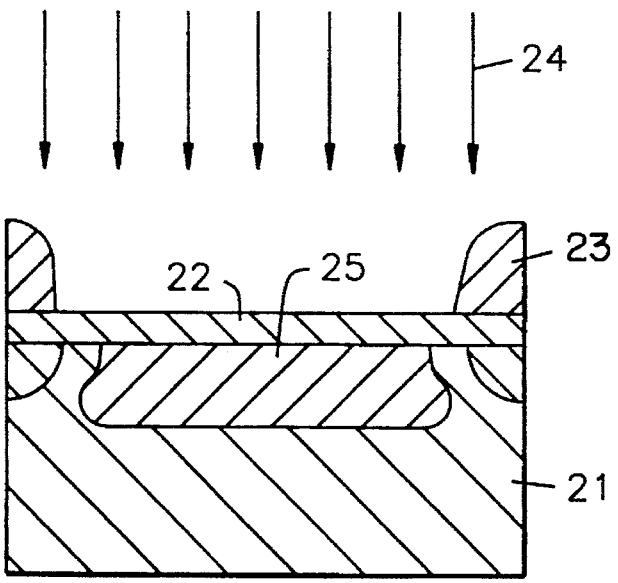
FIG. 1 is a process sequence sectional view for explaining the manufacturing method of semiconductor device of the invention.
Figure 2:
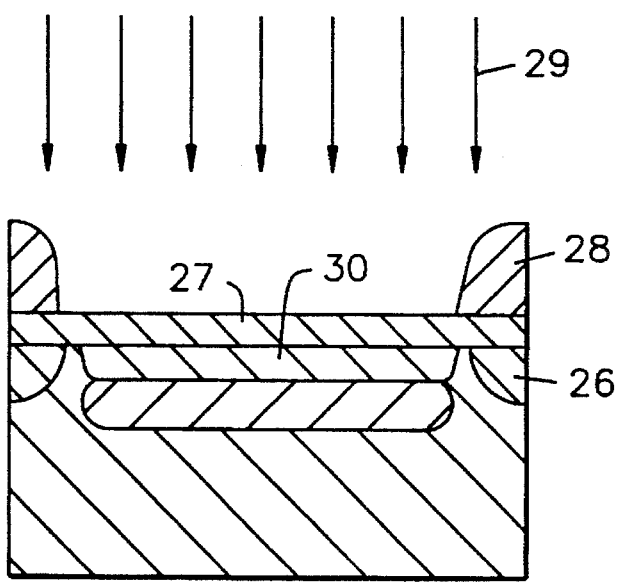
FIG. 2 is a process sequence sectional view for explaining the manufacturing method of semiconductor device of the invention.
Figure 3:
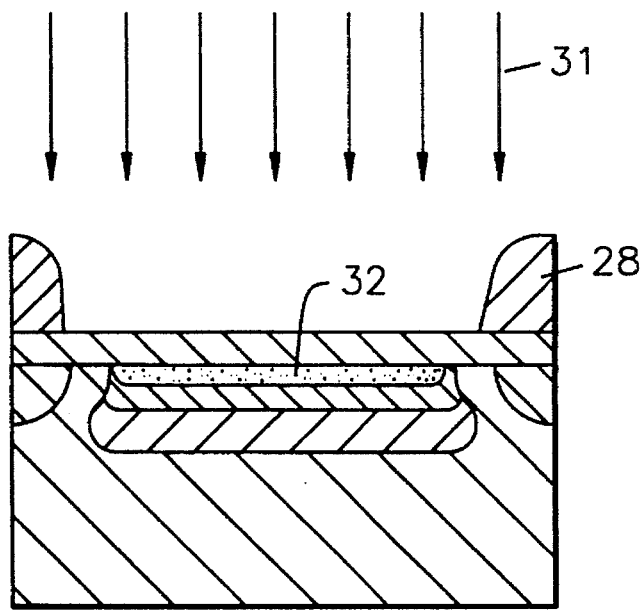
FIG. 3 is a process sequence sectional view for explaining the manufacturing method of semiconductor device of the invention.

FIG. 1 through FIG. 3 indicate the process sectional views in an embodiment of the invention.

In FIG. 1, a dielectric film 22 which is an oxide film in a film thickness of 100 nm is formed on a P type silicon substrate 21 or a silicon substrate 21 with P type wells. Afterwards, a resist is applied, exposed and developed on the dielectric film 22, and a specified resist pattern 23 is formed. Using this resist pattern 23 as the mask, a phosphorus ion beam 24 is implanted. The ion implantation conditions are acceleration energy of 150 keV and dose of $2 \times 10^{12}$ cm$^{-2}$ (FIG. 1).

Then, removing the resist pattern 23, heat treatment is conducted. The heat treatment is performed for two hours at 1200 deg. C in order to extend the diffusion distance in the silicon substrate 21 for phosphorus ions. By this heat treatment, a photo diode 25 is formed in a depth of about 1 μm. In other method of forming the photo diode 25, ion implantation may be introduced at a high acceleration energy of about 500 keV. In this case, the heat treatment time may be shortened, or the heat treatment temperature may be lowered. The diffusion depth of the photo diode 25 must be adjusted depending on the sensitivity to the wavelength of the light entering the photo diode 25. For example, in visible light, the diffusion depth of photo diode 25 is about 1 to 2 μm, and in infrared light, the depth is about 3 to 4 μm. This is because the depth of invasion and absorption in the silicon substrate 21 varies depending on the wavelength of the light. Hence, to raise the sensitivity of the photo diode 25, the depth must be adjusted by the light of desired wavelength.

Applying, exposing and developing a resist again on the dielectric film 22, a specified resist pattern (not shown) is formed. Using this resist pattern as the mask, boron ions are implanted. Thus, a channel stopper region 26 is formed. This resist patter is later removed. This channel stopper region 26 is formed in order to isolate electrically from the adjacent device. The impurity concentration is set at about $10^{19}$ cm$^{-3}$ in order to prevent inversion of the silicon substrate surface. The depth of diffusion is about 0.6 μm. At this time, the ion implantation conditions are acceleration energy of 40 keV and dose of 1 to $3\times10^{13}$ cm$^{-2}$. Afterwards, the dielectric film 22 is removed. Again, on the silicon substrate 21, a dielectric film 27 is formed as an oxide film in a thickness of about 100 nm. Then, in the region other than the region for the photo diode 25 on the dielectric film 27, a resist pattern or stacked oxide film 28 is formed. The thickness of the stacked oxide film 28 is about 200 nm. The stacked oxide film 28 may be either an oxide film formed by CVD or sputtering, or an oxide film formed by forming a polysilicon film on the silicon substrate 21, and oxidizing the polysilicon film surface. Using this stacked oxide film 28 as the mask, a boron ion beam 29 is implanted. The ion implantation conditions are acceleration energy of 50 keV and dose of $1\times10^{14}$ cm$^{-2}$. In such conditions, a P type diffusion layer 30 of opposite conductive type for photo diode 25 is formed on the surface of the photo diode 25, and the leak current in the photo diode 25 decreases (FIG. 2). The P type diffusion layer 30 is formed by heat treatment for 30 minutes at temperature of 900 deg. C after ion implantation. The depth of the P type diffusion layer 30 is 0.4 μm.

Consecutively, a fluorine ion beam 31 is implanted on the entire surface of the silicon substrate 21. The ion implantation conditions are acceleration energy of 20 keV to 40 keV and dose of $3\times10^{13}$ cm$^{-2}$ to $3\times10^{14}$ cm$^{-2}$ approximately. For implanting the fluorine ion beam 31, $BF_2$ gas is used. Thus, a diffusion layer 32 by fluorine is provided on the surface of the photo diode 25 and on the surface of the P type diffusion layer 30. The fluorine ion implantation is defined in such conditions in order to evaluate the leak current dependent of the fluorine implantation dose (FIG. 3).

The reason of defining the acceleration energy within 20 to 40 keV is the range of conditions in which the defects caused by fluorine ion implantation may be sufficiently smaller than the defects caused by boron ion implantation in the preceding step. Accordingly, by implanting fluorine ions to the sample implanted with ions in such conditions, the decrease of leak current by fluorine can be evaluated. In this case, boron ions are implanted after implanting the fluorine ions, but if the implantation order of fluorine and boron ions is inverted, there is no problem at all.

As other method of independently implanting boron and fluorine, fluorine atoms can be introduced by using molecular ions such as $BF_2$. In this method, however, a double quantity of boron is implanted, and the acceleration energy is automatically defined to a high acceleration energy of 19/11 times that of boron. Hence, the degree of freedom in setting of ion implantation dose and acceleration energy is extremely lowered, and it is difficult to realize the optimum conditions for reducing the leak current.

Herein, the acceleration energy is 19/11 times that of boron because the acceleration energy is distributed proportionally depending on the mass of each ion. The mass number of fluorine ($m_F$) is 19, and that of boron ($m_B$) is 11. Supposing the present acceleration energy to be E, the acceleration energy of fluorine $E_F$ is given in the following formula.

$$E_F=(m_F\times E)/(2\times m_F+m_B)$$

Thus the handling differs between when molecular ions are used and when ions of boron and fluorine are implanted independently.

That is, when molecular ions such as $BF_2$ and BF ions are used as ion seeds in fluorine ion implantation, the fluorine atoms are introduced into the silicon substrate 21 simultaneously with boron atoms. For example, $BF_2$ ions are implanted at the acceleration energy of 155 keV and dose of $1\times10^{14}$ cm$^{-2}$. At this time, the depth distribution of impurity concentration for boron and fluorine corresponds to the acceleration energy of 35 keV by independent boron ion implantation. In the case of fluorine, it corresponds to the acceleration energy of 60 keV. Accordingly, the fluorine is introduced nearly into the same depth as in the boron impurity concentration distribution, and defects by ion implantation are generated simultaneously in the inner depth of the silicon substrate 21. Afterwards, by heat treatment, if the boron ion implantation region is diffused and extended, it is located at a deeper position than the defect introduced by fluorine ion implantation. Therefore, when a voltage is applied to the photo diode 25, a depletion layer is formed in the photo diode 25, and this depletion layer extends. As a result, the depletion layer reaches the defect caused by fluorine ion implantation. When the depletion layer reaches this defect, a leak current is generated therefrom, and the device characteristic is extremely deteriorated. In the device in which the leak current hardly matters, ion implantation by using $BF_2$ may be applied, but in the case of handling feeble electric charge such as sold-state image pickup device, only a slight leak current may become a dark current in the image, and a white blemish may occur unexpectedly. It is therefore easier in use to implant boron and fluorine ions separately. As shown in FIG. 2, preliminary forming of P type diffusion layer 30 on the surface of the photo diode 25 is essential for preventing the depletion layer from extending to the surface side electrically as mentioned earlier.

Incidentally, between the diffusion width in the lateral direction of the N type diffusion layer which is the photo diode 25 near the surface of the silicon substrate 21, and that of the P type diffusion layer 30, the both ends of the diffusion regions in the lateral direction in the drawing are matched in both diffusion layers, but it is not always necessary to match. By the P type diffusion layer 30 formed on the surface of the silicon substrate 21, as far as the N type diffusion layer is covered so that the high concentration portion of the N type diffusion layer as the photo diode 25 is not present on the surface, it is not necessary that the depletion layer should be extended to the surface, and there is no problem. If the depletion layer is extended to the surface, the leak current is increased by the interface level existing on the surface of the silicon substrate 21.

Figure 4:
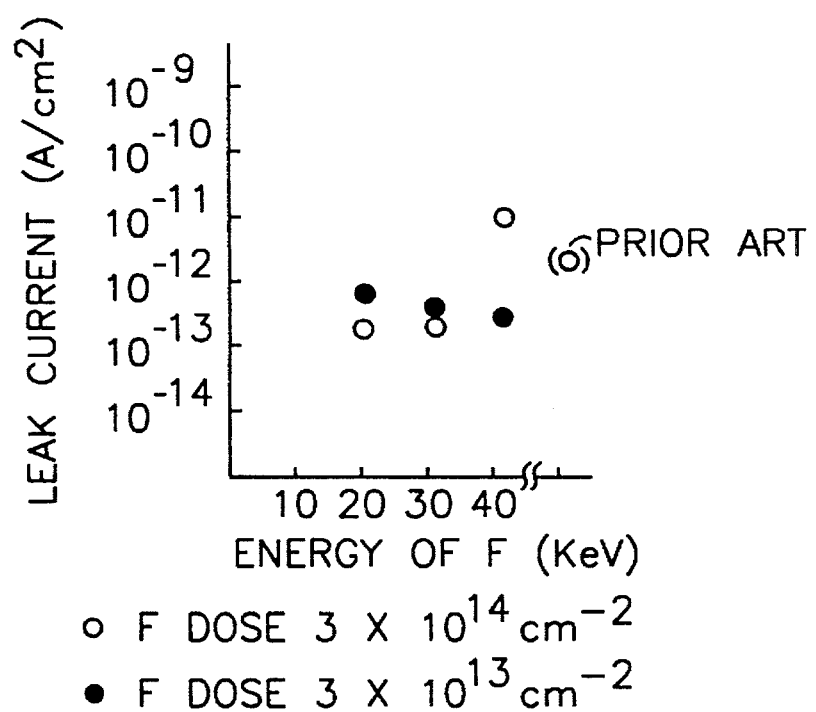
FIG. 4 is a diagram showing the relation between fluorine implantation energy and leak current.

In the photo diode formed in this manner, the leak current characteristics have been evaluated. The results are shown in FIG. 4. The axis of ordinates denotes the leak current, and the axis of abscissas represents the acceleration energy in fluorine ion implantation. In the specimen for reference in the diagram, fluorine ion is not implanted.

In the sample with fluorine ion implantation, a notable decreasing effect was observed in the leak current of diode.

In the fluorine ion implantation, in samples of high dose and high acceleration energy of 20 or 30 keV. However, in the sample of which dose is reduced to $3\times10^{13}$ cm$^{-2}$, the leak current decreasing effected is noted even at 40 keV.

Figure 5:
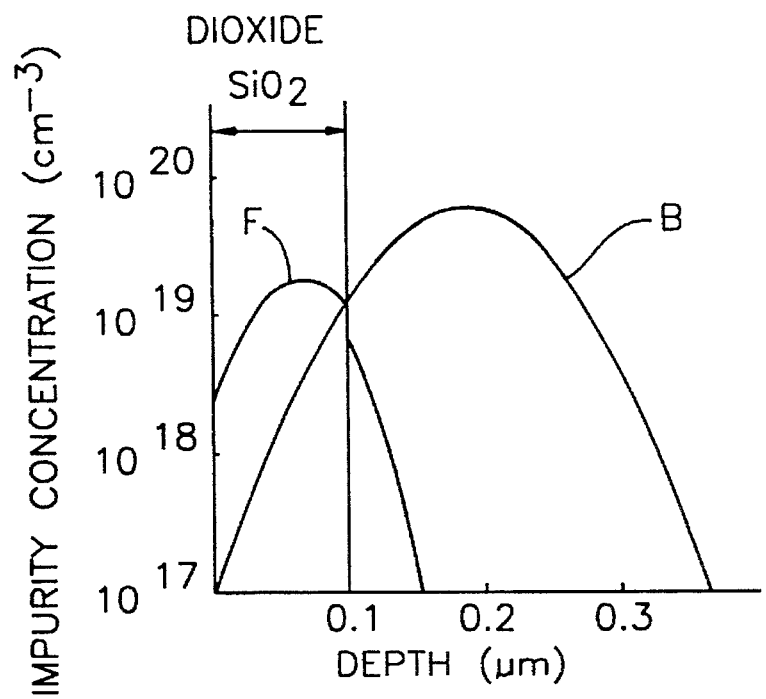
FIG. 5 is a diagram showing the impurity concentration distribution in silicon substrate by ion implantation of boron and fluorine.
Figure 6:
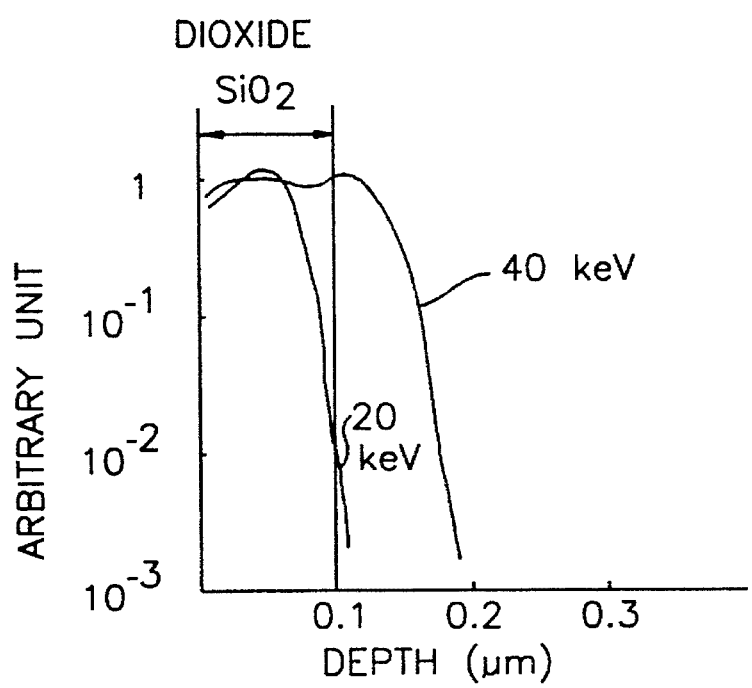
FIG. 6 is a diagram showing a depth direction distribution of defects by fluorine ion implantation.

This reason is explained by reference to FIGS. 5 and 6. In FIG. 5, the axis of abscissas refers to the depth from the silicon substrate, and the axis of ordinates represents the impurity concentration. In FIG. 6, the axis of abscissas denotes the depth from the silicon substrate, and the axis of ordinates shows the defect amount. In both cases, an oxide film of thickness of about 0.1 μm is stacked up on the silicon substrate.

If the acceleration energy is 20 keV or less, the implanted fluorine ions are mostly introduced into the oxide film on the silicon substrate, and hardly reach up to the silicon substrate. Accordingly, at the acceleration energy of 20 keV or less, the leak current cannot be decreased. However, when the thickness of the oxide film which is the surface dielectric film becomes thin, fluorine is introduced into the silicon substrate even at this acceleration energy. For example, when the thickness of the oxide film is 30 nm, if the acceleration energy is 15 keV, the leak current at that time can be reduced. FIG. 5 shows distribution profiles of the impurities by boron ion implantation at the acceleration energy of 50 keV and dose of $3\times10^{14}$ cm$^{-2}$ through an oxide film of 0.1 μm in thickness, and fluorine ion implantation at the acceleration energy of 30 keV and dose of $1\times10^{14}$ cm$^{-2}$. I is known from this diagram the fluorine diffusion layer 32 is formed thinly on the surface of the silicon substrate 21, as compared with the boron distribution implanted for forming the P type diffusion layer 30 on the surface of the silicon substrate 21 in FIG. 2.

FIG. 6 shows the result of calculation by Monte Carlo simulation concern to defect amount by fluorine ion implantation at acceleration energy of 40 and 20 keV and dose of $1\times10^{14}$ cm$^{-2}$. At the acceleration energy of 40 keV, many defects are formed not only in the oxide film but also in the silicon substrate. The defects formed herein may be recovered to such an extent by the heat treatment conducted right after ion implantation. However, the amount of residual defects not recovered by heat treatment is proportional to the amount of primary defects generated at the time of ion impurities. Hence, the fewer the primary defects generated, the smaller secondary defects are induced by them, so that the increase of leak current may be prevented. It is known from FIG. 6 that the defects are decreased by about two digits when the acceleration energy was lowered from 40 keV to 20 keV. It is therefore necessary to control so that defects caused by fluorine ion implantation may not be introduced into the silicon substrate as far as possible. In particular, it is important to introduce so that the defects caused by fluorine ion implantation may not affect the defects caused by boron ion implantation. The defect amount in the silicon substrate is the sum of the defects caused by fluorine ion implantation and defects caused by boron ion implantation. In this case, in order that the defects caused by fluorine ion implantation may not give rise to increase of leak current so as to be almost negligible, the amount of the fluorine to be implanted should be more than one digit less than the boron amount.

As known from the result, since the fluorine is introduced into the shallow portion beneath the silicon substrate, it is considered there is no effect on the junction of the P diffusion layer 30 formed on the surface of the photo diode 25 as shown in FIG. 2.

When using the solid-state image pickup device, the problem is that tiny residual defects not found in FIG. 2 are present. If they are in the junction of the P diffusion layer, when driving the solid-state image pickup device, the depletion layer of the photo diode contacts with the defect, and the leak current increases. As a result, white blemish is formed by leak current. It is thus important to form the defects caused by ion implantation within the shallow part from the silicon substrate surface as far as possible. However, it is when the depletion layer contacts with the defect that an adverse effect of defect is caused. In other words, it is not always enough that the defect caused by fluorine ion implantation be formed merely remote from the junction position of the P type diffusion layer 30.

Figure 7:
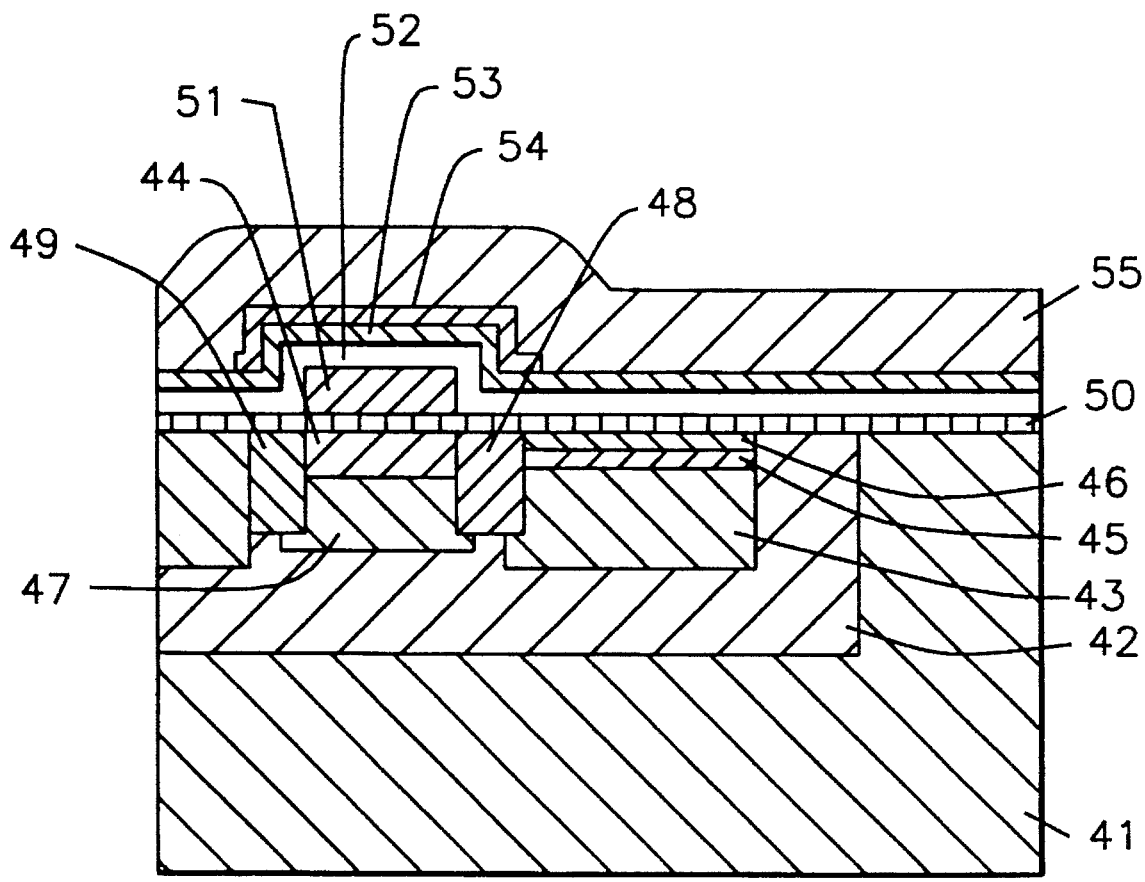
FIG. 7 is a device sectional view for explaining the solid-state image pickup device of the invention.

In FIG. 7, the embodiment of the solid state image pickup device having charge coupled device type applying the invention is explained in detail below.

First of all, the N type semiconductor substrate 41 has a plane azimuth of (100), and its impurity concentration is about $10^{14}$ cm$^{-3}$. On the N type semiconductor substrate 41, a first P type diffusion layer 42 is formed. The depth of the first P type diffusion layer 42 is about 5 μm. The impurity concentration of the first P type diffusion layer 42 is about $10^{16}$ cm$^{-3}$. The first P type diffusion layer 42 is provided in order to discharge overflown charge in the photo diode 43. That is, the photo diode 43 is formed as an N type diffusion layer on an N type semiconductor substrate 41. In the photo diode 43, by the light entering from outside, an electric charge (photo carrier) is formed, and it is temporarily stored inside. If the charge is accumulated more than stored in the photo diode 43, it flown into other region from the photo diode 43. When such electric charge enters a transfer channel 44 of the N type diffusion layer, it may cause blooming. The occurrence of blooming may be prevented by forming a first P type diffusion layer 42. The potential of the first P type diffusion layer 42 is fixed at zero volt. Hence, in the potential distribution in these regions, the electric charge generated in the photo diode 43 is discharged into the N type semiconductor substrate 41 through the first P type diffusion layer 42. By setting the impurity concentration of the first P type diffusion layer 42 at the specified value, the photo diode 43 may be easily depleted when the solid state image pickup device operates, and the quantity of the signal charge may increase. The depth of the first P type diffusion layer 42 is determined by the depth of the photo diode 43 and the breakdown voltage between the two. The depth of the photo diode 43 is required to be about 2 μm in order to obtain a sufficient photoelectric conversion efficiency when light in visible light region enters.

In the first P type diffusion layer 42, an N type diffusion layer is formed as a photo diode 43. When light enters the photo diode 43, an electron pair of electron and hole is generated in the depletion layer of the photo diode 43. The electron turns out to be a signal charge through the adjacent transfer channel 44. The hole is taken out of the N type semiconductor substrate 41 through the first P type diffusion layer 42. In this way, the photo diode 43 converts the incident light into the signal charge. The impurity concentration of the photo diode 43 is about $10^{18}$ cm$^{-3}$. In side the surface of the photodiode 43, a second P type diffusion layer 45 is formed. The result of formed the second P type diffusion layer 42 is following. Through photo diode 43 is formed adjacent to the semiconductor substrate 41 and the boundary of a gate dielectric film 50, leak current occur by the effect of the boundary traps. In the result, a characteristic of the device is lowed.

The second P type diffusion layer 45 has higher impurity concentration. Because, at the time of device operation, the second P type diffusion layer 45 prevents depletion layer from reaching the boundary of silicon as the semiconductor substrate 41 and the gate dielectric film 50. The boron impurity concentration of the second P type diffusion layer 45 is $10^{15}$ cm$^{-2}$ or more. Generally, ion-implanted boron with amount of the impurity concentrate, defects by ion-implantation occur in the semiconductor substrate 41 and leak current flow through them. In the result of it, the dark current can not be prevented. The hydrogen anneal process prevents the injected defects from generating. When entering a light and adding a heat treatment, hydrogen atoms conducted in the semiconductor substrate 41 get away from the interface between the silicon substrate and the oxide film. By such phenomena, the elements fabricated using the hydrogen anneal is poor for the stability. After remaining the elements formany hours, the problem for the reliability of the elements occure.

Therefore, on the surface of the second P type diffusion layer 45 and photo diode 43, fluorine diffusion layer 46 is formed. The fluorine diffusion layer 46 can decrease leak current through defects generated in the second P type diffusion layer 45.

Then, in the first P type diffusion layer 42, a third P type diffusion layer 47 is formed. The third P type diffusion layer 47 prevents electric charge as noise generated in the semiconductor substrate 41 form diffusing into the transfer channel 44. Herein, the third P type diffusion layer 47 is about 1 µm. The impurity concentration of the third P type diffusion layer 47 is about $10^{18}$ cm$^{-3}$.

The third P type diffusion layer 47 is used for enclosing the transfer channel 44 composed of N type diffusion layer. Generally, such structure is called the Hi-C structure. When the diffusion depth of the third diffusion layer 47 is increased by heat treatment, diffusion in the lateral direction is promoted at the same time. Hence, the third P type diffusion layer 47 invades up to the photo diode 43. When the third diffusion layer 47 invades into the photo diode 43, the photoelectric conversion output is lowered. The transfer channel 44 transfers the signal charge formed in the photo diode 43 into a specific region. Herein, the diffusion depth of the transfer channel 44 is about 0.5 µm. The impurity concentration of the transfer channel 44 is $10^{18}$ to $10^{17}$ cm$^{-3}$. To realize the Hi-C structure, the third P type diffusion layer 47 must be set wider than the transfer channel 44.

When reading out the signal charge generated in the photo diode 43 into the transfer channel 44, the potential of the transfer channel 44 is set lower than that of the photo diode 43. When the signal charge conveyed to the transfer channel 44 flows back to the photo diode 43 or the signal charge is present in the transfer channel 44, the signal charge formed in the photo diode 43 must be prevented from flowing into the transfer channel 44. Accordingly, a fourth P type diffusion layer 48 for controlling the potential at the time of reading out is formed between the photo diode 43 and the transfer channel 44. If a signal charge is transferred from the photo diode 43 to the transfer channel 44, the potential in the fourth P type diffusion layer 48 is controlled to be lower than the potential of the transfer channel 43, and same as or slightly higher than the potential of the transfer channel 44. When the signal charge is accumulated in the transfer channel 44, in order that the signal charge may not flow back into the photo diode 43, the potential of the fourth P type diffusion layer 48 is controlled to be higher than that of the photo diode 43, and higher than that of the transfer channel 44.

The diffusion depth of the fourth P type diffusion layer 48 is about 1 µm. The surface concentration of the fourth P type diffusion layer 48 on the semiconductor substrate surface is $10^{16}$ to $10^{17}$ cm$^{-3}$. When the voltage of the driving pulse for operating the solid state image pickup device is zero volt or 15 V, it is necessary to prevent the signal charge from flowing back from the transfer channel 44 into the photo diode 43, or to cause the signal charge to flow in from the photo diode 43 into the transfer channel 44. In order to achieve the threshold voltage capable of maintaining an optimum potential distribution in each state, the diffusion depth of the fourth P type diffusion layer 48 and the impurity concentration are defined. The width of the fourth P type diffusion layer 48 should be preferably about 1 µm or less. If the width of the fourth P type diffusion layer 48 is more than 1 µm, the gm characteristic of the transistoris impaired. As the gm characteristic becomes inferior, it is impossible to read out the signal charge accumulated in the photo diode 43 completely. To the contrary, if the width of the fourth P type diffusion layer 48 is less than about 1 µm, a short channel effect takes place. By the short channel effect, punch-through is likely to occur, as a result, the photoelectric conversion output of the photo diode 43 becomes smaller.

In the solid state image pickup device, photo diodes 43 and transfer channels 33 compose pairs, and are formed in a matrix. To separate a pair and an adjacent pair electrically, a fifth P type diffusion layer 49 is formed. The fifth P type diffusion layer 49 is formed by ion implantation. The depth of the fifth P type diffusion layer 49 is about 1 µm. The surface concentration of the fifth P type diffusion layer 49 is $10^{17}$ to $10^{18}$ cm$^{-3}$.

The surface concentration of the fifth P type diffusion layer 49 must be set in the above range in order that the signal charge accumulated in the adjacent photo diode 43 may not flow in. If the surface concentration is smaller than $10^{17}$ cm$^{-3}$, the signal charge of the adjacent photo diode 43 flows in. If the surface concentration is more than $10^{18}$ cm$^{-3}$, a narrow channel effect occurs in the adjacent transfer channel 44. As a result of the narrow channel effect, the transfer capacity of the transfer channel 44 is lowered. Hence, the dynamic range of the solid state image pickup device becomes small, and the transfer efficiency is impaired.

The width of the fifty P type diffusion layer 49 should be about 1 µm or less. If the width of the fifth P type diffusion layer 49 is larger than 1 µm, area of the transfer channel 33 decreases. That is, the signal charge accumulated in the photo diode 43 cannot be read out completely. To the contrary, if the width of the fifth P type diffusion layer 49 is smaller than 1 µm, a short channel effect occurs. By the short channel effect, punch-through is likely to occur between the adjacent photo diode 43 and transfer channel 44. As a result, reading out the information in the adjacent photo diode 43, the resolution is lowered. Furthermore, the output of the photo diode 43 is lowered.

On the N type semiconductor substrate 41, a gate dielectric film 50 is to be silicon oxide film grown. The gate dielectric film 50 is formed by pyrogenic oxidation method. The thickness of the gate dielectric film 50 is preferably 50 nm or more in order to raise the transfer efficiency by utilizing the fringing effect.

The transfer gate electrode 51 is formed by patterning the polysilicon grown by the low pressure CVD method. The sheet resistance of the transfer gate electrode 51 is scores of ohms. The thickness of the transfer gate electrode 51 is about 500 nm. The transfer gate electrode 51 is used for applying a driving pulse for transfer, by reading out the signal charge formed by the photo diode 43 into the transfer channel 44. Thus, the transfer gate electrode 51 is desired to be as low in resistance as possible. However, if the phosphorus dope is increased for the purpose of lowering the resistance, the surface of the transfer gate electrode 51 is oxidized, and the breakdown voltage of the interlayer film 52 is deteriorated, and hence the phosphorus dope should be preferably in the amount specified above. On the surface of the transfer gate electrode 51, an interlayer film 52 composed of polysilicon oxide film is grown.

The interlayer film 52 is grown by oxidizing the surface of the transfer gate electrode 51 by pyrogenic oxidation process. The thickness of the interlayer film 52 is about 200 nm. The interlayer film 52 is formed so as to maintain a breakdown voltage. Due to the etching residue of the polysilicon film caused by etching at the time of forming the transfer gate electrode 51, when a driving voltage is applied, leak occurs through the etching residue on the polysilicon film. By burning out the etching residue of polysilicon when forming the interlayer film 52, leak may be prevented. Since the four-phase driving pulses applied to the transfer gate electrode 51 change in the level such as −7 V, 0 V, and +15 V, the interlayer film 52 has the breakdown voltage of more than the maximum differential voltage of 22 V.

On the surface of the interlayer film 52, the interlayer film 53 of polysilicon oxide film is formed. The thickness of the interlayer film 53 is about 100 n. The interlayer film 53 is formed by CVD method. The interlayer film 53 is formed in order to prevent local lowering of the breakdown voltage due to pin hole or the like in the interlayer film 52.

The light-shield film 54 is formed for preventing smear noise generated by the entrance of light into the transfer channel 44. On the light-shield film 54 and the interlayer film 53, a interlayer dielectric film 55 is formed. The thickness of the interlayer dielectric film 55 is 200 nm.

Referring now to FIGS 8 to 13, the manufacturing method of CCD solid state image pick up device using the invention mentioned above is described below.

Figure 8:
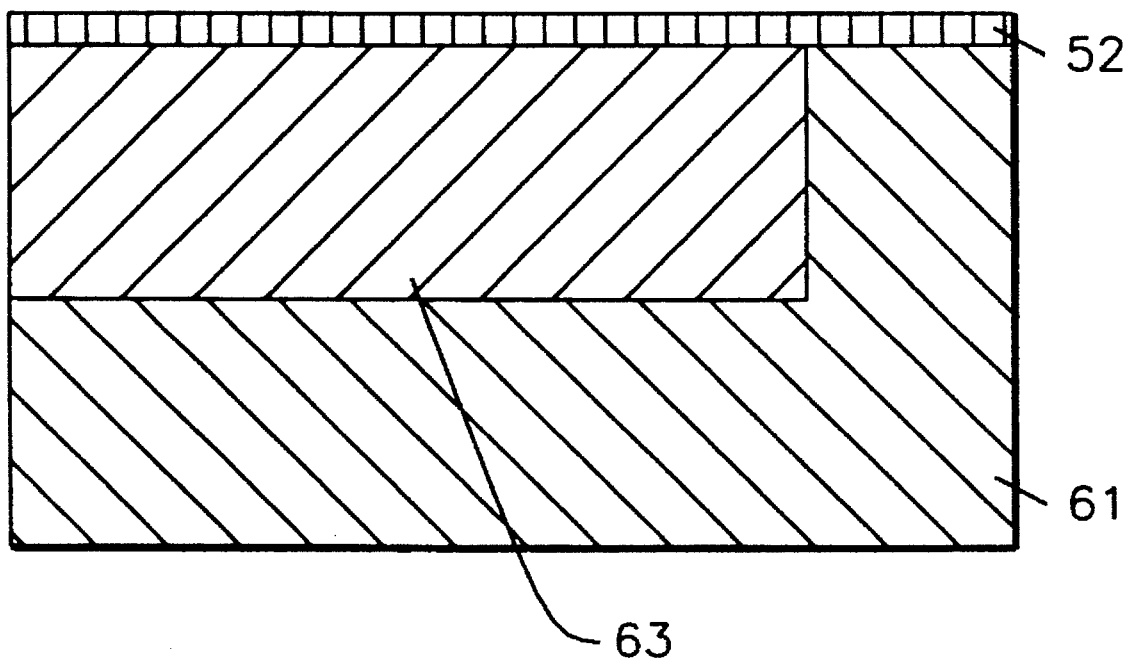
FIG. 8 is a process sequence sectional view for explaining the manufacturing method of solid-state image pickup device of the invention.

First, on the principal plane of an N type semiconductor substrate 61, a thermal oxide film 62 of about 100 nm in thickness is formed. A photoresist (not shown) is spin-coated on the N type semiconductor substrate 61, and the region of a first P type diffusion layer 63 is exposed and developed, thereby forming a resist pattern. Using the resist pattern as the mask, boron ions are implanted. At this time, the ion implantation condition is the acceleration voltage of 100 keV and implantation dose of about $10^{12}$ cm$^{-2}$. Afterwards, in N$_2$ atmosphere, heat treatment is conducted for several hours at temperature of 1100° C., and the boron ions are diffused to a depth of about 5 μm beneath the N type semiconductor substrate 61, thereby forming a first P type diffusion layer 63. At the same time, by the heat treatment, the ion-implanted boron is activated (FIG. 8).

Consequently, a photoresist (not shown) is spin-coated on the N type semiconductor substrate 61, the region for a photo diode 64 is exposed and developed, thereby forming a resist pattern. Using this resist pattern as the mask, phosphorus ions are implanted. At this time, the ion implantation condition is the acceleration voltage of several hundred keV and implantation dose of about $10^{12}$ cm$^{-2}$. Later, in N$_2$ atmosphere, heat treatment is conducted at 1000° C. or higher. As a result, the diffusion depth of the photo diode 64 is about 2 μm. Thus, the photo diode 64 is formed in the specified region of the first P type diffusion layer 63.

Removing the resist from the N type semiconductor substrate 61, a photoresist (not shown) is applied again on the N type semiconductor substrate 61. By exposing and developing the region for a third P type diffusion layer 65, a resist pattern is formed. Using this resist pattern as the mask, boron ions are implanted. At this time, the ion implantation condition is the acceleration voltage of about 100 keV and the implantation does of $10^{12}$ cm$^{-2}$. As a result, the diffusion depth of the third P type diffusion layer 65 is finally about 1 μm. Thus is formed the third P type diffusion layer 65 in the first P type diffusion layer 63 which is a P type well, for preventing the electric charge which becomes noise generated in the N type semiconductor substrate 61 from diffusing into the transfer channel 66.

Furthermore, removing the resist pattern from the N type semiconductor substrate 61, a photoresist (not shown) is formed on the N type semiconductor substrate 61. By exposing and developing the transfer channel 66, a resist pattern is formed. Using this resist pattern as the mask, phosphorus ions are implanted. At this time, the ion implantation condition is acceleration voltage of about 100 keV, and implantation dose of $10^{12}$ cm$^{-2}$. As a result, the diffusion depth of the transfer channel 66 is about 0.5 μm. Thus is formed the transfer channel 66.

Consequently, removing the photoresist form the N type semiconductor substrate 61, a photoresist (not shown) is formed again on the N type semiconductor substrate 61. By exposing and developing the region of a fourth P type diffusion region 67, a resist pattern is formed. Using the resist pattern as the mask, boron ions are implanted. At this time, the ion implantation condition is the acceleration voltage of scores of keV and implantation dose of $10^{12}$ cm$^{-2}$. As a result, the diffusion depth of the fourth P type diffusion layer 67 is about 1 μm. By implanting in such condition, the threshold voltage between the photo diode 64 and transfer channel 66 can be controlled. Thus is formed the fourth P type diffusion layer 67 for controlling the potential for reading out the photo carrier from the photo diode 64 to the transfer channel 66, between the photo diode 64 and transfer channel 66.

Figure 9:
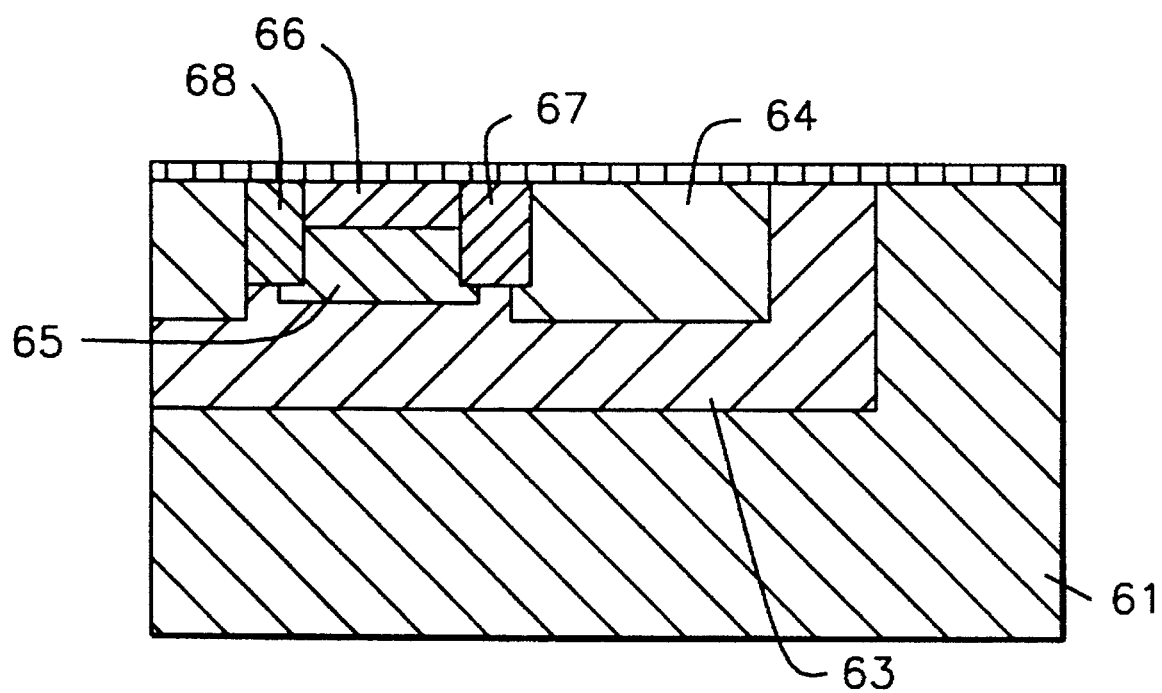
FIG. 9 is a process sequence sectional view for explaining the manufacturing method of solid-state image pickup device of the invention.

Next, removing the photoresist from the N type semiconductor substrate 61, a photoresist (not shown) is spin-coated again on the N type semiconductor substrate 61. Exposing and developing the region for a fifth P type diffusion layer 68, a resist pattern is formed. Boron ions are implanted in the resist pattern as a mask. At this time, the ion implantation condition is the acceleration voltage of scores of keV and implantation dose of about $10^{13}$ cm$^{-2}$. As a result, the diffusion depth of the fifth P type diffusion layer 68 is about 1 μm. Since the fifth P type diffusion layer 68 separates form the adjacent element, the threshold voltage is set higher so as not to conduct at a voltage applied at the time of operation. For this purpose, the impurity concentration of the fifth P type diffusion layer 68 is set relatively high. In particular, it should be set higher than the impurity concentration of the fourth P type diffusion layer 67 (FIG. 9).

As a gate dielectric film 69, sequentially, a silicon oxide film is grown to a thickness of about 50 nm by pyrogenic oxidation method. Thereon, a polysilicon film is grown to a thickness of about 600 nm by low pressure CVD method, and its sheet resistance is adjusted to about 10 Ω by phosphorus doping. On this polysilicon film, a photoresist is spin-coated, and exposed and developed, and a resist pattern are forming a transfer gate electrode 70 is formed. Using this resist pattern as the mask, a polysilicon film is subjected to reactive ion etching in a mixed atmosphere of fluorine gas and chlorofluorocarbon gas, thereby forming the transfer gate electrode 70.

Figure 10:
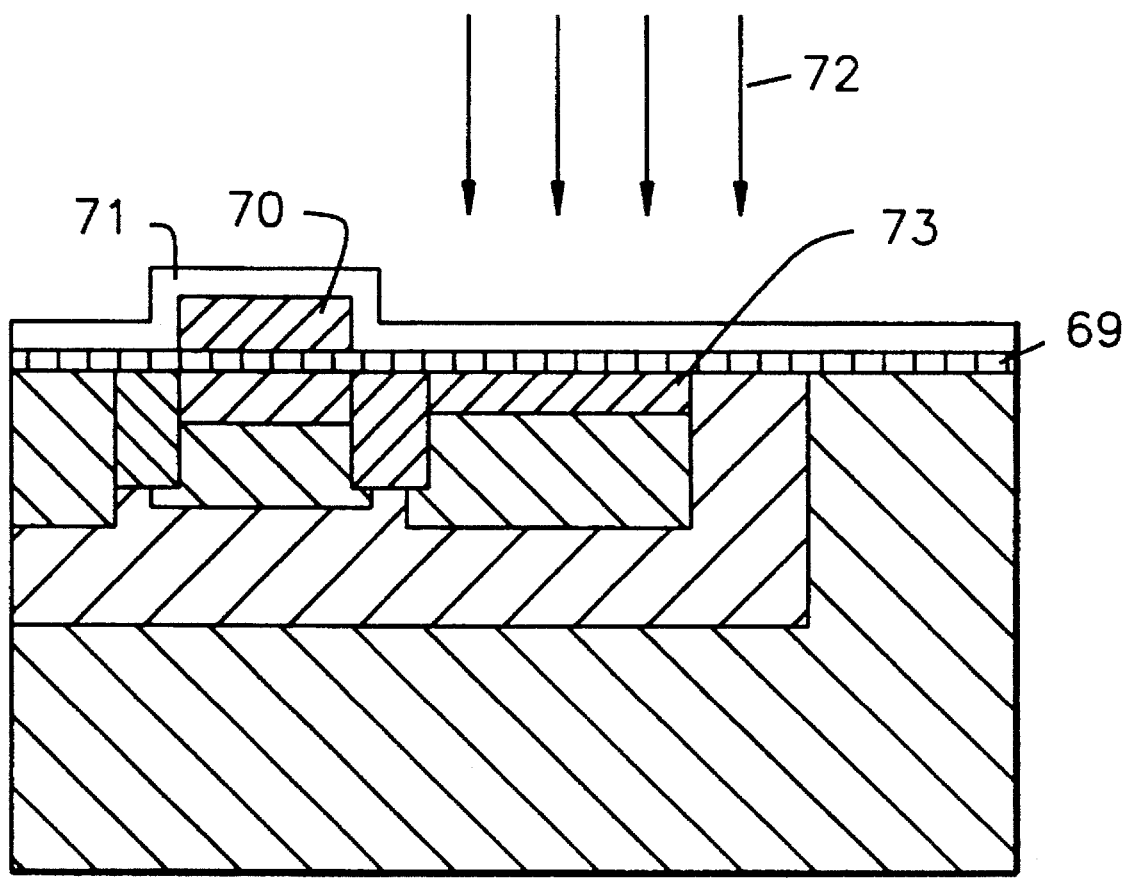
FIG. 10 is a process sequence sectional view for explaining the manufacturing method of solid-state image pickup device of the invention.

Afterwards, removing the resist pattern, an interlayer film 71 of about 300 nm in thickness is grown. Above this substrate, implanted boron ions 72, a second P type diffusion layer 73 having the high impurity concentration is formed. At this time, the ions are implanted into the semiconductor substrate 61 using the both of the interlayer film 71 and the transfer gate electrode 70 as mask (FIG. 10).

The, by fluorine ions 74 implanted using the same mask, a fluorine diffusion layer 75 is formed. Afterwards, heat treatment is conducted and the third P type diffusion layer 73 is diffused.

Figure 11:
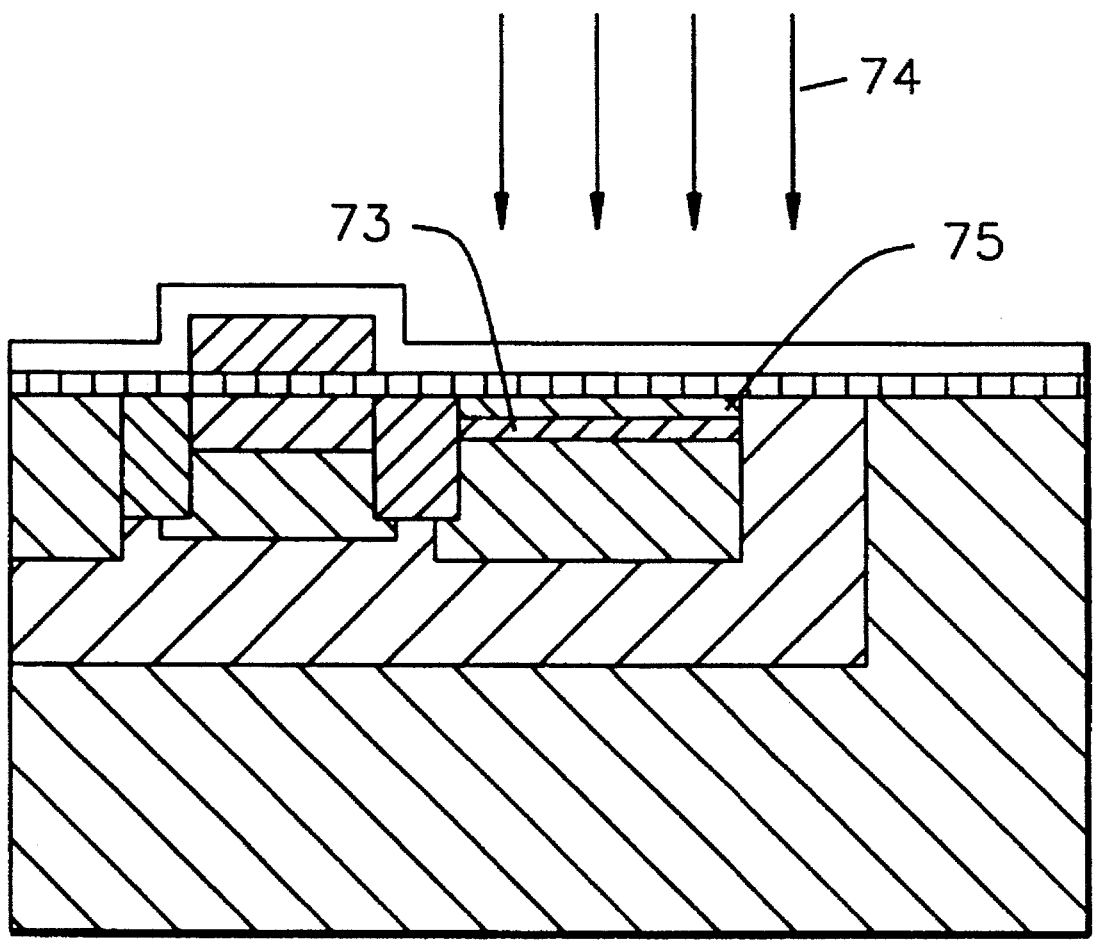
FIG. 11 is a process sequence sectional view for explaining the manufacturing method of solid-state image pickup device of the invention.

At this time, the implantation condition of boron ion is the acceleration voltage of scores of keV and implantation dose of $10^{12}$ cm$^{-2}$. And the implantation condition of fluorine ion is the acceleration voltage of 30 keV and implantation dose of $10^{13}$ cm$^{-2}$ (FIG. 11).

Figure 12:
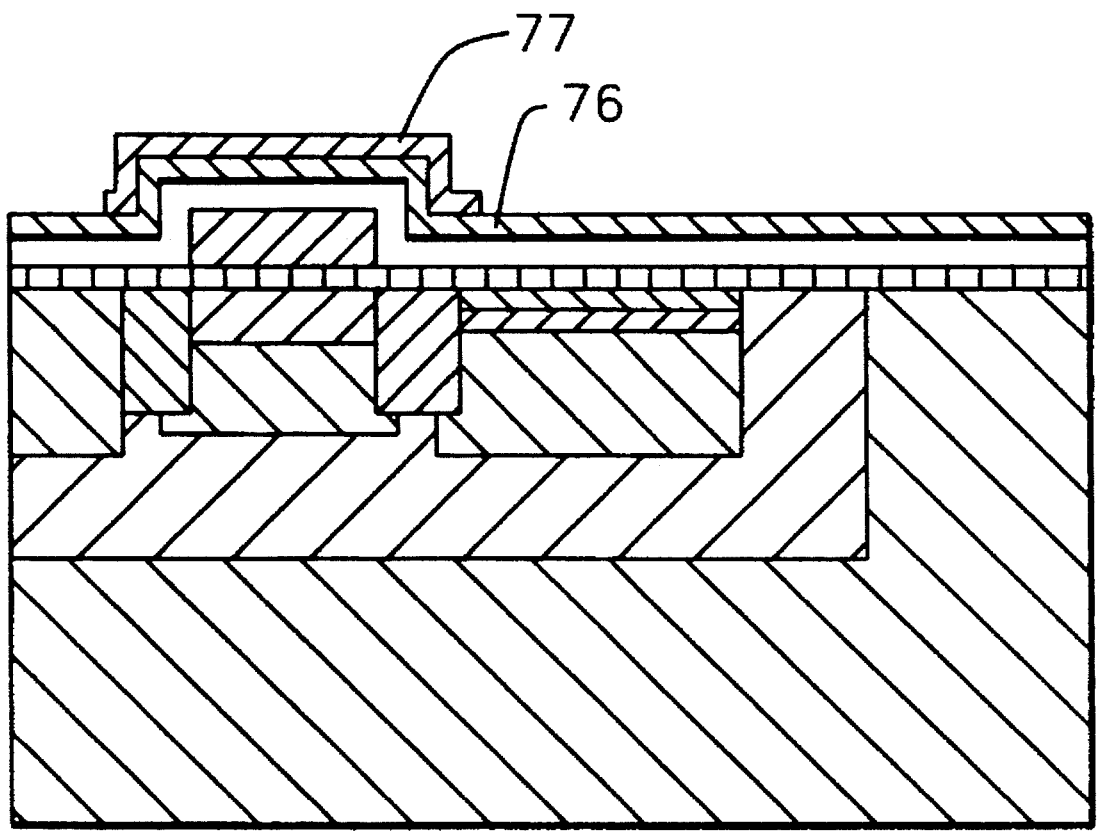
FIG. 12 is a process sequence sectional view for explaining the manufacturing method of solid-state image pickup device of the invention.

As a gate dielectric film 69, sequentially, an interlayer film 76 composed a silicon oxide film is grown on the substrate. Thereon, on the interlayer film 76, sequentially, an aluminum film is grown as a light-shield film 77. On this aluminum film a photoresist (not shown) is spin-coated, and exposed and developed, and a resist pattern for forming the light-shield film 77 is formed. Using this resist pattern as the mask, the aluminum film is subjected to reactive ion etching in a mixed atmosphere of fluorine gas and chlorofluorocarbon gas, thereby forming the light-shield film 77 (FIG. 12).

Figure 13:
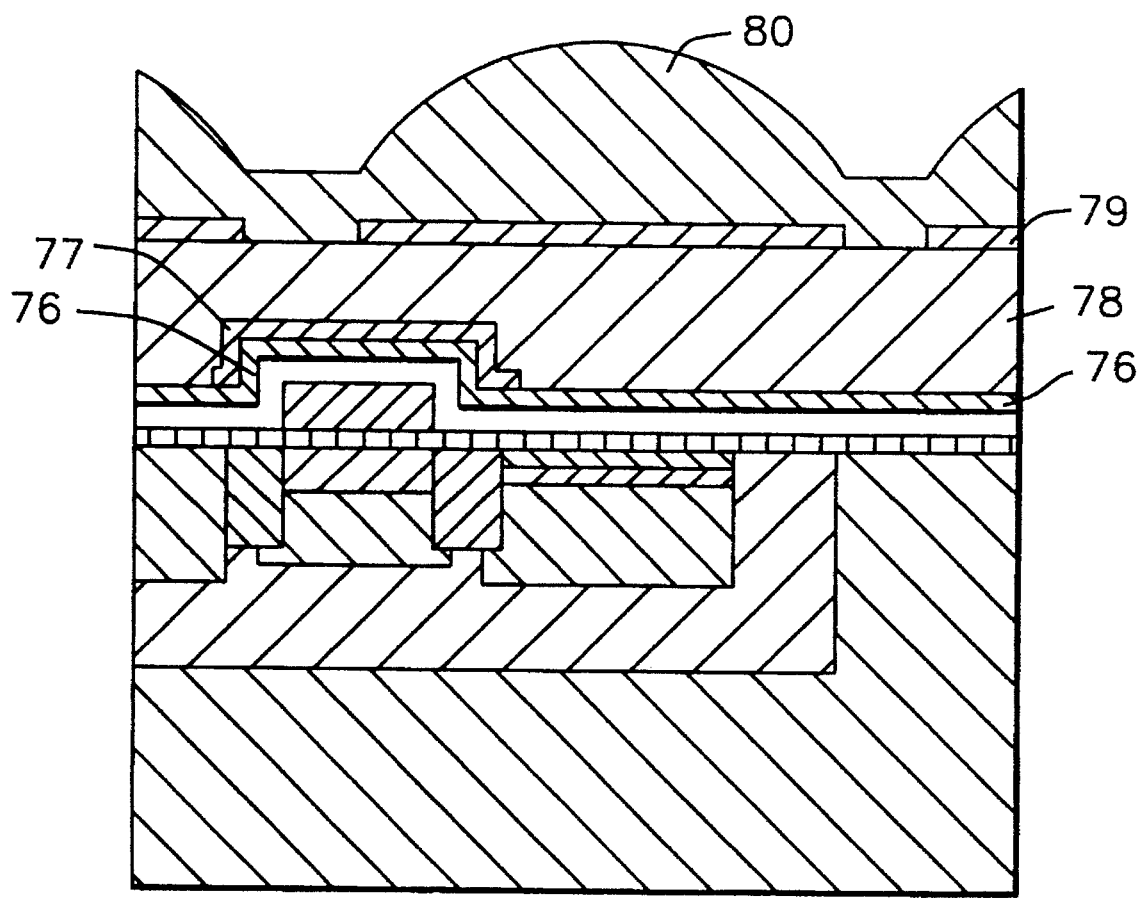
FIG. 13 is a process sequence sectional view for explaining the manufacturing method of solid-state image pickup device of the invention.
Figure 14:
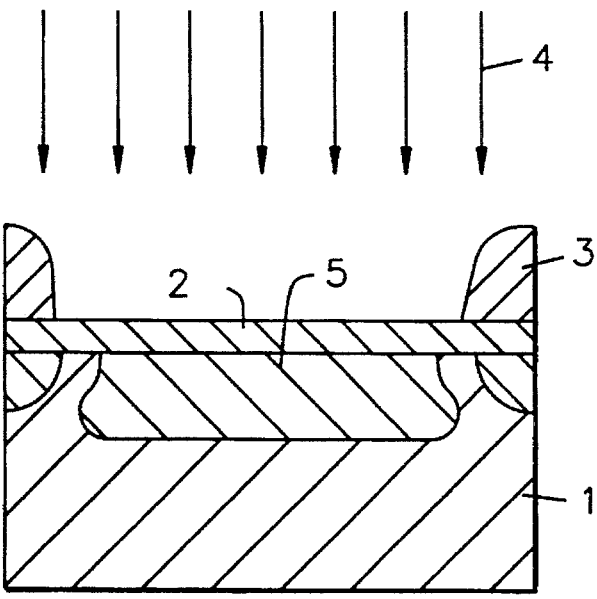
FIG. 14 is a process sequence sectional view for explaining the manufacturing method of conventional semiconductor device.
Figure 15:
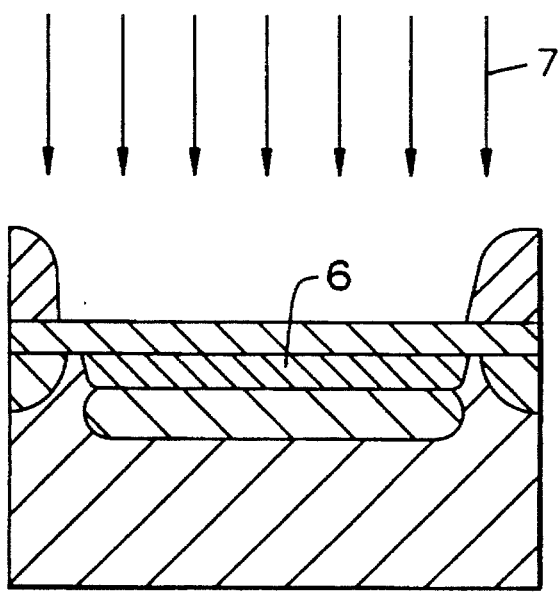
FIG. 15 is a process sequence sectional view for explaining the manufacturing method of conventional semiconductor device.
Figure 16:
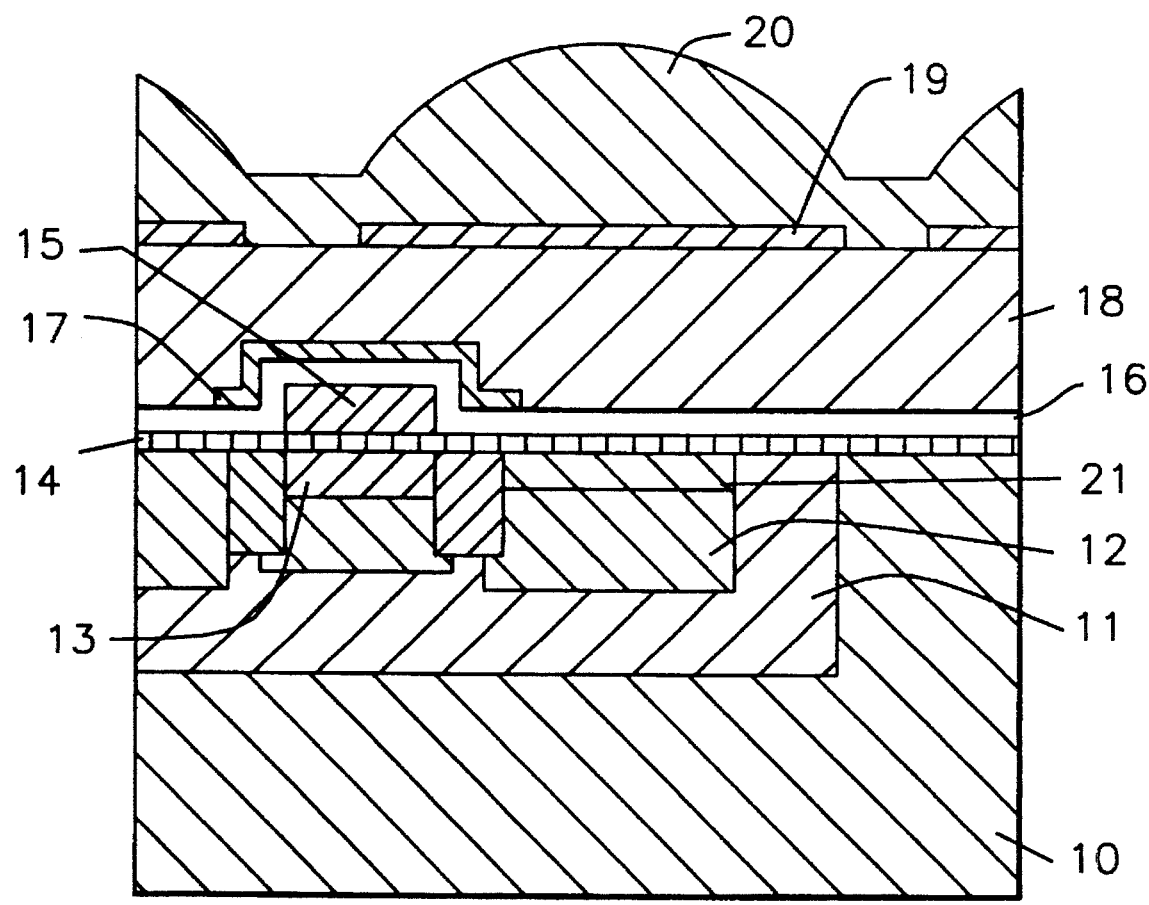
FIG. 16 is a device sectional view for explaining the conventional solid-state image pickup device.

Consequently, a BPSG film is formed as an interlayer dielectric film 78 by atmosphere pressure CVD method using a mixed gas of silane gas, phosphine gas and diborane gas. The mixing ratio of silane gas, phosphine gas and diborane gas is determined so that the boron and phosphorus concentration of the BPSG film may be about 3 wt. % and about 6 wt. %, respectively. The thickness of this BPSG film is about 600 nm. Next, in an N$_2$ atmosphere, by heat treatment at 900° C., a flow is induced in this BPSG film, and the uppermost surface of the interlayer dielectric film 78 is flattened. Then, if induced heat treatment at 900° C. or higher, the impurity profile of the diffusion layer formed so far on the N type semiconductor substrate 61 is changed, and the reading characteristic and saturation output of the solid state image pickup device are lowered. Color filters 79 are formed on the interlayer dielectric film 78. Finally, on the uppermost of the substrate, microlens 80 are formed (FIG. 13).

The number of white blemishes caused when fluorine was implanted in the CCD solid state image pickup device was confirmed to be ⅓ that of the reference material without fluorine implantation. Effects were also observed at the does of $1\times10^{14}$ cm$^{-2}$. However, at the acceleration energy of 40 keV, when exceeding the dose of $1\times10^{14}$ cm$^{-2}$, white blemishes increased.

By implantation fluorine so as not to cause implantation defects in the boron depletion layer, the leak current can be decreased by reducing the interface level.

Therefore, the spirit and scope of the appended claims should not be limited to the description of the preferred versions contained herein.

What is claimed is:

1. A method of manufacturing a semiconductor device comprising:

at least a step of forming a photo diode of one conductive type on a semiconductor substrate, a step of forming an impurity layer of opposite conductive type of said photo diode on a surface of said photo diode formed on said semiconductor substrate, and a step of implanting fluorine ions into the impurity layer, wherein said fluorine ions are implanted through a dielectric film formed on said semiconductor substrate, and the fluorine ion implantation is effected at such an acceleration energy that a maximum dose of the fluorine ion implantation appears in said dielectric film while a substantial implant dose of the fluorine ion appears in said impurity layer.

2. A method of manufacturing a solid-state image pickup device comprising:

a step of forming a photo diode of one conductive type on a semiconductor substrate, a step of forming a transfer channel on said semiconductor substrate at a specific gap from said photo diode;

a step forming a gate dielectric film on said semiconductor substrate, a step of forming a transfer gate electrode on said transfer channel through said gate dielectric film, a step of forming an interlayer film on said transfer gate electrode, a step of forming diffusion layers on a surface of said photo diode by implanting ions of an impurity of the opposite conductive type of said photo diode and ions of fluorine simultaneously or alternately from above said interlayer film, and a step of forming a light-shield film on said interlayer film on said transfer gate electrode for shielding said transfer channel from light, wherein said fluorine implantation is effected through a dielectric film formed said semiconductor substrate and said fluorine ion implantation is effected at such an acceleration energy that a maximum dose of said fluorine ion implantation appears in said dielectric film, while a substantial implant dose of the fluorine ions appears in said first diffusion layer.

* * * * *